US012641851B2

(12) United States Patent
Zhu et al.

(10) Patent No.: US 12,641,851 B2
(45) Date of Patent: *May 26, 2026

(54) TRANSISTORS WITH SOURCE-CONNECTED FIELD PLATES

(71) Applicant: NXP B.V., Eindhoven (NL)

(72) Inventors: Congyong Zhu, Gilbert, AZ (US);
Bernhard Grote, Phoenix, AZ (US);
Bruce McRae Green, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 726 days.

This patent is subject to a terminal disclaimer.

(21) Appl. No.: 17/645,280

(22) Filed: Dec. 20, 2021

(65) Prior Publication Data

US 2023/0197797 A1      Jun. 22, 2023

(51) Int. Cl.
| | |
|---|---|
| *H10D 64/00* | (2025.01) |
| *H10D 30/01* | (2025.01) |
| *H10D 30/47* | (2025.01) |
| *H10D 62/85* | (2025.01) |
| *H10P 50/28* | (2026.01) |
| *H10W 10/00* | (2026.01) |
| *H10W 10/50* | (2026.01) |

(52) U.S. Cl.
CPC ......... *H10D 64/111* (2025.01); *H10D 30/015* (2025.01); *H10D 30/475* (2025.01); *H10D 62/8503* (2025.01); *H10P 50/283* (2026.01); *H10W 10/00* (2026.01); *H10W 10/01* (2026.01); *H10W 10/051* (2026.01); *H10W 10/50* (2026.01)

(58) Field of Classification Search
None
See application file for complete search history.

(56) References Cited

U.S. PATENT DOCUMENTS

| | | | |
|---|---|---|---|
| 6,867,078 B1 | 3/2005 | Green et al. | |
| 7,291,872 B2 | 11/2007 | Hikita et al. | |
| 7,592,211 B2 | 9/2009 | Sheppard et al. | |
| 7,696,535 B2 | 4/2010 | Yang et al. | |
| 7,812,369 B2 | 10/2010 | Chini et al. | |
| 8,049,252 B2 | 11/2011 | Smith et al. | |
| 8,120,064 B2 | 2/2012 | Parikh et al. | |
| 8,946,779 B2 | 2/2015 | Green et al. | |
| 9,419,122 B1 | 8/2016 | Corrion et al. | |
| 9,741,840 B1 | 8/2017 | Moens et al. | |
| 9,847,411 B2 | 12/2017 | Sriram et al. | |

(Continued)

FOREIGN PATENT DOCUMENTS

| | | |
|---|---|---|
| CN | 11232661 A | 2/2021 |
| CN | 113628964 A1 | 11/2021 |
| WO | WO-2017069464 A1 | 4/2017 |

OTHER PUBLICATIONS

U.S. Appl. No. 17/561,793, filed Dec. 24, 2021, 51 pages.

(Continued)

*Primary Examiner* — Jack S Chen

(57) ABSTRACT

Placement of a field plate in a field-effect transistor is optimized by using multiple dielectric layers such that a first end of field plate is separated from a channel region of the transistor by a first set of one or more distinct dielectric material layers. A second end of the field plate overlies the channel region and a control electrode from which it is separated by the first set of dielectric layers and one or more additional dielectric layers.

9 Claims, 7 Drawing Sheets

(56) References Cited

U.S. PATENT DOCUMENTS

| | | | |
|---|---|---|---|
| 9,911,817 | B2 | 3/2018 | Xia et al. |
| 12,148,820 | B2 * | 11/2024 | Zhu ........................ H01L 29/402 |
| 2006/0060895 | A1 | 3/2006 | Hikita et al. |
| 2008/0128752 | A1 | 6/2008 | Wu |
| 2012/0146107 | A1 | 6/2012 | Lim et al. |
| 2013/0193485 | A1 | 8/2013 | Akiyama et al. |
| 2013/0341679 | A1 | 12/2013 | Green et al. |
| 2014/0061659 | A1 | 3/2014 | Teplik et al. |
| 2014/0361343 | A1 | 12/2014 | Sriram |
| 2015/0279722 | A1 | 10/2015 | Kikuchi |
| 2017/0154988 | A1 | 6/2017 | Hurkx et al. |
| 2018/0033669 | A1 | 2/2018 | Salih et al. |
| 2019/0028006 | A1 | 1/2019 | Hamamura et al. |
| 2019/0097001 | A1 | 3/2019 | LaRoche et al. |
| 2019/0140086 | A1 | 5/2019 | Chikamatsu |
| 2021/0336043 | A1 * | 10/2021 | Birner ................... H01L 29/407 |
| 2021/0376148 | A1 | 12/2021 | Lee |

OTHER PUBLICATIONS

U.S. Appl. No. 17/561,796, filed Dec. 24, 2021, 51 pages.
Denninghoff, Daniel J. et al; "Design of High-Aspect-Ratio T-Gates on N-Polar GaN/AlGaN MIS-HEMTs for High f max"; IEEE Electron Device Letters, vol. 33, No. 6; 3 pages (Jun. 2012.

Elkashlan, R. Y. et al; "Analysis of Gate-Metal Resistance in CMOS-Compatible RF GaN HEMTs"; IEEE Trans. On Electron Devices, vol. 67, No. 11; 5 page (Nov. 2020).
Green, B. M. et al; "A High Power Density 26 V GaAs pHEMT Technology"; IEEE MTT-S Int'l Microwave Symposium Digest, Fort Worth, TX, US; 4 pages (2004).
Lee, Kiwon et al; "Improved DC and RF Performance of High Power AlGaN/GaN HEMTs with a Novel Inner Field-plate"; Proceedings of Asia-Pacific Microwave Conference; 4 pages (2006).
Piel, Pierre-Marie et al; "A 26 Volts, 45 Watts GaAs pHEMT for 2 GHz WCDMA Applications"; IEEE MTT-S Int'l Microwave Symposium Digest; Fort Worth, Texas, US; 4 pages (2004).
Xie, Gang et al; "Breakdown Voltage Enhancement for Power AlGaN/GaN HEMTs with Air-bridge Field Plate"; 24th Int'l Symposium on Power Semiconductor Devices and ICs, Bruges, BE; 2 pages (Jun. 2012).
Non Final Office Action; U.S. Appl. No. 17/645,276; 22 pages (Sep. 3, 2024).
Notice of Allowance; U.S. Appl. No. 17/645,286; 10 pages (Aug. 26, 2024).
Non Final Office Action; U.S. Appl. No. 17/645,290 19 pages Aug. 30, 2024.
Notice of allowance; U.S. Appl. No. 17/645,290 10 pages Feb. 14, 2025.
U.S. Appl. No. 17/645,276; Notice of Allowance dated Mar. 11, 2025 13 pages.

* cited by examiner

TRANSISTORS WITH
SOURCE-CONNECTED FIELD PLATES

FIELD OF THE INVENTION

Embodiments of the subject matter described herein relate generally to semiconductor devices with conductive elements and methods for fabricating such devices.

BACKGROUND OF THE INVENTION

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications. Field plates are used to reduce gate-drain feedback capacitance and to increase device breakdown voltage in high frequency transistors. Accordingly, there is a need for semiconductor and, in particular, GaN devices with field plates.

SUMMARY OF THE INVENTION

In an example embodiment, a method of fabricating a semiconductor device is provided. The method includes receiving a semiconductor substrate. The substrate has a channel region suitable for use as a transistor channel, a field plate dielectric in direct contact with a top surface of the substrate that overlies the channel region, and additional dielectric material that overlies and directly contacts the field plate dielectric. The method further includes simultaneously forming first and second apertures in the additional dielectric material above the channel region, forming a control electrode within the first aperture that directly contacts the top surface of the substrate, and forming a field plate electrode in the second aperture that is separated from the top surface of the substrate by the field plate dielectric. The first aperture is disposed at a location between a first end of the channel region and a second end of the channel region. The second aperture is separated from the first aperture by the additional dielectric material and disposed at a location between the first aperture and the second end of the channel region.

In one or more aspects forming the first and second apertures includes selectively removing a portion of the additional dielectric material using a first etching process that preferentially removes the additional dielectric material without exposing the top surface of the substrate beneath the field plate dielectric.

In another example embodiment, a semiconductor device is provided. The device includes a channel region within a semiconductor substrate. The channel region suitable for use as a semiconductive transistor channel and has a first end and a second end. The device also includes a first current terminal electrically coupled to the first end of the channel region and a second current terminal coupled to the second end of the channel region; a field plate dielectric disposed in direct contact with a top surface of the substrate above the channel region; additional dielectric material disposed above the field plate dielectric. The device also has a control electrode and a field plate electrode.

A first aperture passes through the field plate dielectric and the additional dielectric material at a location between the first end of the channel region and the second end of the channel region. The control electrode has a first end that electrically contacts the channel region within the first aperture and a second end that overlies the additional dielectric material adjacent to the first aperture. Third dielectric material is disposed above the control electrode and above the additional dielectric material.

A second aperture is disposed in the additional dielectric material above the channel region at a location between the control electrode and the second end of the channel region; and an aperture in the third dielectric material is disposed above the second aperture in the additional dielectric material. The field plate electrode has first end (e.g., first end 152, 352, 452, 652) that is capacitively coupled to the channel region across the field plate dielectric within the second aperture in the additional dielectric material. The field plate electrode also has a second end (e.g., second end 154, 354, 454, 654) that overlies the control electrode and is separated from the control electrode by the third dielectric material. In or more embodiments, the field plate electrode is electrically coupled to the first terminal.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
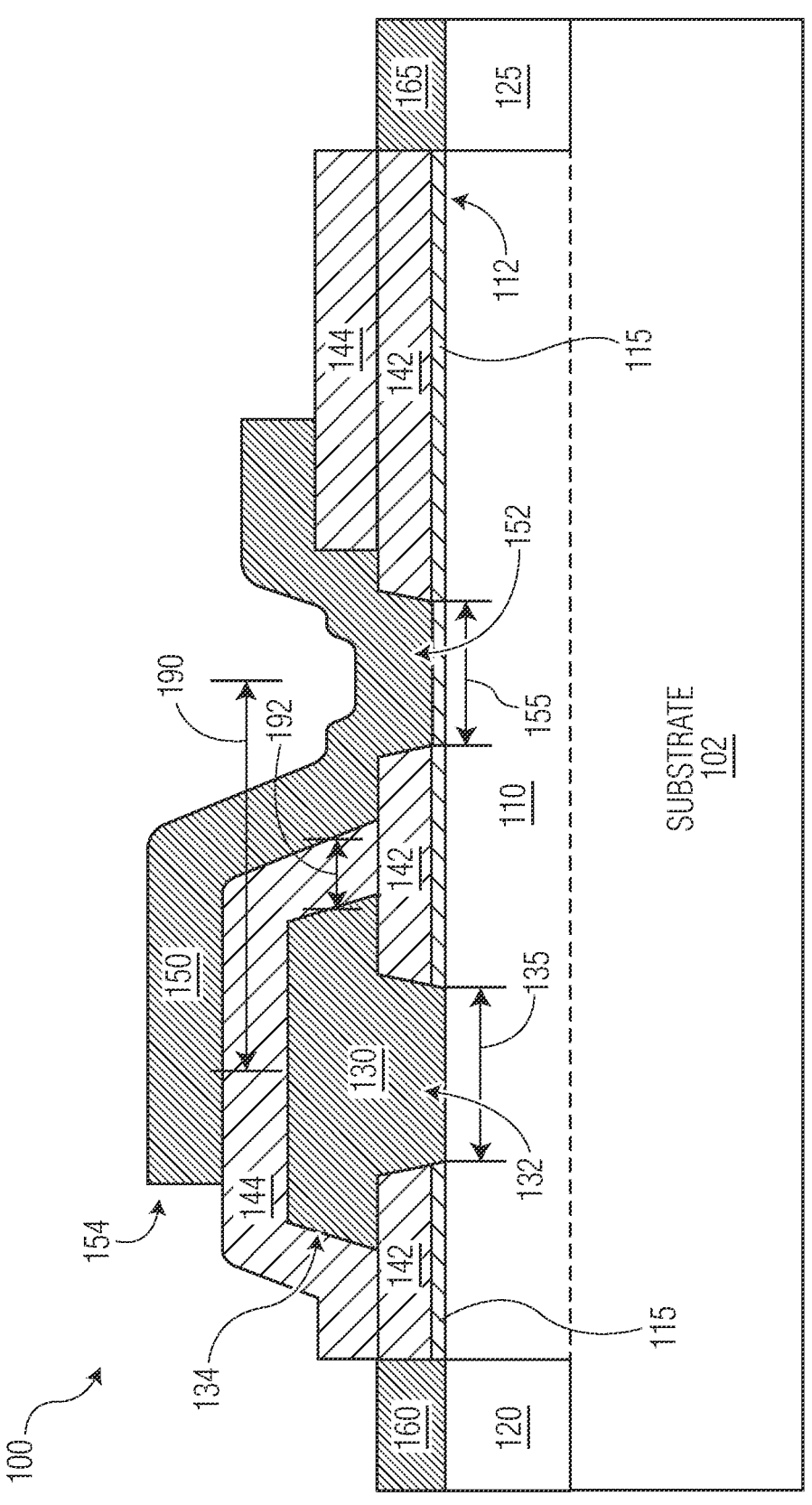
FIG. 1 is a cross-sectional schematic view of an example transistor according to embodiments herein.

The following detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Devices according to embodiments herein may be fabricated using any suitable processes including those that omit steps described above, perform those steps and similar steps in different orders, and the like. It will also be appreciated that well-known features of transistors may be omitted for clarity. For example, the Figures may not show additional dielectric layers and vias which may be present in one or more embodiments FIG. 1 is a cross-sectional schematic view of example transistor 100 provided with an electrode suitable for use as a field plate according to embodiments herein. The transistor 100 is formed on a semiconductor substrate 102 and has a channel region 110 near a top surface 112 of the substrate 102. The transistor 100 includes a first current terminal 120 electrically coupled to a first end of the channel region 110 and a second current terminal 125 electrically coupled to a second end of the channel 110 opposite the first current terminal 120. A field plate dielectric 115 is disposed on the top surface 112 overlying the channel region 110. The first current terminal 120 and the second current terminal 125 may be formed by any suitable method. For example, they may be appropriately doped regions within the semiconductor substrate 102, or as metallic contacts deposited within recesses in the substrate 102 or on the surface of the substrate 102. As shown, the current terminals 120,125 are overlaid by respective metallic contacts 160,165. The field plate dielectric 115 is overlaid as shown by second and third dielectric materials 142,144. The field plate dielectric is disposed between a field plate electrode 150 and the top surface 112, as described further below. It will be understood that, in some embodiments, the field plate dielectric 115 may also serve as a surface passivation material for the top surface 112.

A conductive first electrode (hereinafter a control electrode 130) contacts the channel region 110 through an aperture 135 in the field plate dielectric 115 and the second dielectric material 142. As shown, the control electrode 130 has a first end 132 that contacts the channel region 110 within the aperture and optionally has a second end 134 that overhangs the field plate dielectric 115 and second dielectric material 142. Although the control electrode 130 is depicted as having vertical sidewalls, it will be understood that the control electrode 130 may have any suitable geometry. For instance, the first end 132 of the control electrode may have sidewalls that are curved or slanted. Similarly, the second end 134 of the control electrode 130 may be have sidewalls that are curved or slanted and the top surface (farthest from the channel region 110) my have any suitable geometry. The control electrode 130 is disposed in between the first current terminal 120 and the second current terminal 125 along the length of the channel region 110.

It will be appreciated that the first current terminal 120 may be operated, for example, as a source terminal of the transistor 100 and the second current terminal 125 may be operated, for example, as a drain terminal of the transistor 100. It also be understood that the control electrode 130 is suitable for use as a control electrode of the transistor 100 such that, when a suitable bias voltage is applied to the control electrode 130, the channel region 110 is configured to provide an electrically conductive path between the first current terminal 120 and the second current terminal 125.

Additional dielectric material overlies the control electrode 130 and various portions of the channel region 110. For example, as shown in FIG. 1, in one or more embodiments, the dielectric material 142 overlies the field plate dielectric 115 and in some areas, the dielectric material 144 is also present and overlies the dielectric material 142 and the control electrode 130. As shown in FIG. 1, the transistor 100 also includes a second electrode (hereinafter a field plate 150) with a first end 152 disposed above the channel region 110 in between the control electrode 130 and the second current terminal 125. A second end 154 of the field plate 150 overlies the control electrode 130. As shown, the field portion of the field plate 150 that is closest to the channel region 110 is disposed within an aperture 155 in the second dielectric material 142 and additional portions of the field plate 150 are disposed within a wider aperture in the third dielectric material 144. As shown, in or more embodiments a portion of the field plate 150 may overlie the dielectric material 142 and also the dielectric material 144 in an area that is between the aperture 155 and the current terminal 125 (which may be operable as the drain of the transistor 100).

It will be understood that, when the first current terminal 120 is operated as a source terminal of the transistor 100, the field plate 150 may be configured to operate as source-coupled field plate. The field plate 150 may be coupled to the current terminal 120 (operable as the source of the transistor 100) via one or more additional electrically conductive interconnects which are not pictured. In one or more embodiments, the field plate 150 may extend in one or more locations to contact the current terminal 120 directly (i.e., in the cross sectional plane picture or in or more other cross-sectional planes of the transistor 100). In the transistor 100, the conductance of the channel region 110 during operation of the transistor 100 will be influenced by the electrical potential of the control electrode 130 and the field plate 150. It will be appreciated that the first end 152 of the field plate 150 is capacitively coupled to the channel region 110, primarily across the field plate dielectric 115. Meanwhile the field plate 150 is also capacitively coupled to the control electrode 130, primarily across the dielectric material 144.

Generally, a source-coupled field plate such as the field plate 150 may be used to reduce gate-to-drain feedback capacitance ("$C_{GD}$") in transistors such as the transistor 100 when compared to otherwise similar transistors lacking such a field plate. However, the addition of a source-coupled field plate spaced apart from a control electrode such as the control electrode 130 will also tend to introduce additional capacitance between the gate and the source ("$C_{GS}$") which is often an undesirable trade-off. In embodiments herein, multiple dielectric layers may be used to realize a desired value for $C_{GD}$ while mitigating the additional $C_{GS}$ introduced by the field plate.

Meanwhile, in the transistor 100 the use of multiple dielectric layers configured as described may confer certain advantages. Specifically, the relative dielectric constants and thicknesses of each of these materials may be chosen to achieve desired performance characteristics and to facilitate various fabrication procedures in embodiments herein. In one or more embodiments, the field plate dielectric 115 is a silicon oxide or an aluminum oxide. In one or more embodiments, and dielectric material 142 is a nitride, and dielectric material 144 is also a nitride. For instance, in the example of FIG. 1, the relative thicknesses and dielectric constant of the field plate dielectric 115 will tend to determine the effect of the field plate 150 (operating as a source-coupled field plate) on the channel region 110 and $C_{GD}$ of the transistor 100 (i.e., the capacitance between the control electrode 130 and the second current terminal 125). Meanwhile, the dielectric constants and thicknesses of the third dielectric material 144 will largely determine the additional Cos penalty. Thus, a material with a relatively high dielectric constant may be chosen for the field plate dielectric 115 to maximize the influence of the field plate 150 on the channel region 110. Thus, it will be understood that the $C_{GS}$ penalty introduced by the portion of the field plate 150 overlying the control electrode 130 can be mitigated by the presence of the dielectric material 144 in at least two ways according to embodiments herein. First, the distance between the field plate 150 and the control electrode 130 may be increased by the additional thickness added by the dielectric material 144 disposed over the dielectric material 142. Second, the dielectric material 144 may be chosen to have a lower dielectric constant than the dielectric material 142, further reducing unwanted additional $C_{GS}$.

It will be understood that features of the transistor 100 above (and features of other example transistors herein) may be compatible with various transistor technologies. For instance, the transistor 100 and/or any other example transistor according to embodiments herein may be a metal-MOSFET or MISFET fabricated on a silicon substrate or any other suitable semiconductor substrate. For instance, In some embodiments, the transistor 100 is a III-V compound semiconductor-based high-electron-mobility transistor ("HEMT"), otherwise known as a heterostructure field effect transistor ("HFET"). In such embodiments the effective semiconductor channel may be a 2D electron gas ("2DEG") formed at a semiconductor heterojunction disposed with the channel region 110 according to known techniques. In some embodiments, the transistor 100 may be a gallium-nitride (GaN) based HEMT. In some such embodiments, a 2DEG is formed at an interface between a GaN layer and an aluminum doped layer with a stochiometric composition described by the chemical formula $Al_xGa_{1-x}N$ or $Al_xIn_{(1-x)}N$ where x is between zero and one. In such embodiments it will be understood that the effective channel may be buried within the channel region 110 and may not extend to the top surface 112 of the channel region 110. In some embodiments, the field plate dielectric 115 may be a material that provides surface passivation for the channel region 110.

It will be appreciated that the portions of the control electrode 130 and the field plate 150 that are closest to channel region 110 will tend to significantly influence the operating characteristics of the transistor 100. This will be particularly true if, as in one or more embodiments, the field plate dielectric 115 is relatively thin compared to the dielectric materials 142, 144 and/or if the field plate dielectric 115 has a relatively high dielectric constant compared to the dielectric materials 144,142. In such embodiments, it will be appreciated that characteristics of the transistor 100 such Cas, Cos, and source-drain breakdown voltage (as non-limiting examples) will depend upon the relative positioning of control electrode 130 and the field plate 150, particularly the center-to-center distance 190 between the first end 132 of the control electrode 130 within the aperture 135 and the first end 152 of the field plate 150 within the aperture 155. Accordingly, controlling the distances 190,192 will be desirable if many transistors such as the transistor 100 are to be fabricated on a single substrate such as the substrate 102.

Figure 2:
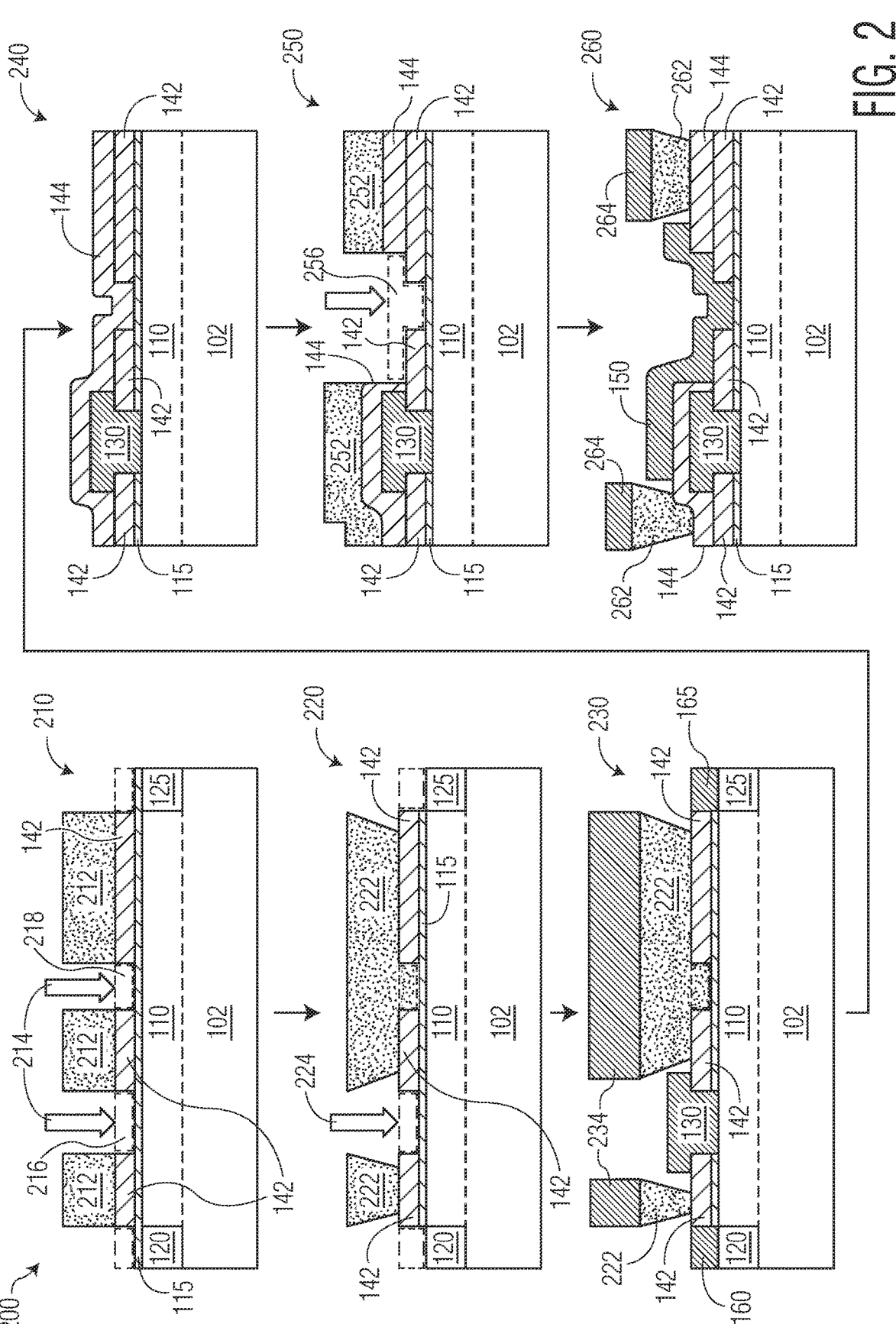
FIG. 2 is cross-sectional schematic illustration of steps in an example process flow that is suitable for use in fabricating the example transistor of FIG. 1 according to embodiments herein.

FIG. 2 illustrates example steps in an example process 200 for fabricating transistors with second electrodes operable as source-coupled field plates according to embodiments herein. The process 200 includes steps 210, 220, 230, 240, 250, and 260 which are depicted being performed to fabricate the transistor 100 of FIG. 1 on the substrate 102. As described below, the process 200 may confer certain advantages by allowing the relative positioning of the aperture 135 and the aperture 155 to be determined at the same time by a single patterning step (e.g., by a single photolithographic exposure) even though the control electrode 130 and the field plate 150 may be formed in separate steps.

As above, the Figures, including FIG. 2 are not necessarily to scale. It will be therefore be appreciated that certain elements of the process 200 as depicted in FIG. 2 and other processes depicted in subsequent figures may omit certain details of relative dimensions and geometries of various elements. As one example, it will be appreciated that in many known lift-off processes, it is desirable for the photoresist thickness to exceed the thickness of the material being lifted off. However, for ease of illustration, the thickness of various sacrificial layers (e.g., the sacrificial and/or etch mask materials 212, 222, 252, 262) may be depicted as being of similar thickness to the materials being lifted off. Similarly, angled and/or under-cut side-wall profiles are frequently desirable in lift-off process but such features may not be explicitly depicted.

At the outset of the process 200, the substrate 102 may already be provided with channel region 110, the field plate dielectric 115 above the top surface 112 of the channel region 110, the dielectric material 142, and with the current terminals 120,125 as described in connection with FIG. 1.

At step 210, the dielectric material 142 is patterned above the field plate dielectric 115. As shown, an etch mask 212 (e.g., photoresist or metal) is deposited and patterned to create openings above the areas 216,218 where the dielectric material 142 is removed using an etch process 214, creating the aperture 155 of FIG. 1 in the process. In one or more embodiments, the dielectric 142 is characterized by a first etch rate with respect to the etch process 214 that is faster than an etch rate of the field plate dielectric 115 with respect to the etch process 214. The etch process 214 may be any suitable etch process including, as a nonlimiting example, an anisotropic plasma sputtering etch or a reactive ion etch process. In one or more embodiments, the field plate dielectric 115 is an aluminum oxide (e.g., $Al_2O_3$ or $Al_2O_x$, where x is a fractional number that is less than or greater than three. In one or more embodiments, the dielectric material 142 may be a silicon nitride layer (e.g., SiN or $SiN_x$, where x is a fractional number that is less than or greater than one. In one or more embodiments the etch process 214 may be a reactive ion etch process that includes ionized fluorine or fluorine compounds (e.g., $CF_4$ and/or $SF_6$) and which may also include oxygen and is known to preferentially etch silicon nitride materials over aluminum oxide materials. Although step 210 is described as a subtractive process above, it will be appreciated that in one more embodiments, the dielectric material 142 may be patterned using any suitable process including additive processes such as a lift-off process in which the dielectric material 142 is deposited over sacrificial material (e.g., photoresist) which is removed to form openings in the areas 216,218.)

In one or more embodiments, the field plate dielectric 115 has a thickness in a range between 20 and 10,000 Ångströms. In or more embodiments the field plate dielectric 115 has a thickness in a range between 50 and 1000 Ångströms. In one or more embodiments, the dielectric material 142 has a thickness in a range between 100 and 2000 Ångströms, although other ranges may be used in one or more other embodiments. Although the thickness ranges above are given as examples, it will be appreciated that other ranges are suitable for use in one or more embodiments. It will be further understood that the choices of materials and thicknesses for various dielectrics may be expressed in terms of an equivalent oxide thickness ("EOT," i.e., the thickness of $SiO_2$ required to produce the same capacitance in a capacitor structure when a different dielectric is used). For instance, a layer of $SiO_2$ with a relative dielectric constant of 3.8 may be used as a reference. As an illustration, a 10 nm-thick layer of $SiO_2$ may be said to have an EOT of 10 nm while a 10 nm-thick layer of $Si_3N_4$ with a relative dielectric constant of 9.5 would have an EOT of only 4 nm as a result of the higher electric permeability of the $Si_3N_4$ material.

At step 220, etch mask material 222 (e.g., photoresist) is deposited and patterned to leave an opening through which field plate dielectric 115 is removed from the opening 216 using an etch process 224, thereby forming the aperture 135 of FIG. 1. Any suitable etch process that preferentially removes the field plate dielectric 115 over the dielectric material 142 and which does not etch the substrate 102 may be used. As an example, in one or more embodiments, a wet chemical etch is used to remove the field plate dielectric 115 without causing damage to the channel region 110 and without removing the etch mask material 222.

For instance, if the field plate dielectric 115 is an aluminum oxide material, a potassium hydroxide solution, buffered oxide etchant (BOE) solution, or tetramethylammonium hydroxide (TMAH) solution may be used to rapidly remove field plate dielectric 115. As shown, the field plate dielectric 115 may optionally be removed above the current terminals 120,125 during step 220 as well. It will be understood that it may be said that an etch "does not remove" a particular material when the etch rate with the respect to that material is zero or inappreciably slow relative to another material that is said to be preferentially etched. In one or more embodiments, as shown, the etch mask material 222 is used both as an etch mask for the etch process 224 and also as a sacrificial material for metal lift-off at step 230.

At step 230, electrically conductive material is deposited and patterned on the substrate 102 using any suitable process. For example, as shown, the etch mask material 222 (e.g., photoresist) is left on the substrate 102 as patterned at step 220. Undesired electrically conductive material 234 resting on the etch mask material 222 is removed, leaving the control electrode 130, as shown in FIG. 1, behind. The etch mask material 222 is then then stripped from the substrate 102 using a solvent, taking the undesired electrically conductive material 234 with it (a lift-off process). It will be appreciated that in other examples other suitable additive or subtractive processes may be used. Optionally, in one or more embodiments, the respective metallic contacts 160,165 are formed above the current terminals 120,125 during step 230 as well. It will be understood that, in or more embodiments, the contacts 160, 165 may be formed during an earlier step instead of during step 230 as pictured. It will be further understood that, in one or more embodiments, a distinct patterning step may be used to deposit new sacrificial material in place of the etch mask material 222 shown at step 230.

At step 240 the dielectric material 144 is deposited over the control electrode 130, the dielectric material 142 and over the area 218 as shown at step 210 (i.e., the aperture 155 as shown in FIG. 1). The current terminals 120,125 are not shown. However, in one or more embodiments, the dielectric material 144 is pattered by any suitable process (e.g., a lift-off process similar to step 230) to leave the current terminals 120,125 and/or the contacts 160,165 exposed. Alternatively, in one more embodiments, the dielectric material 144 is selectively etched above the current terminals 120,125 and/or the contacts 160,165 in a later step (e.g., step 250). For clarity, the current terminals 120, 125 are omitted from the illustration of step 240 and subsequent steps of the process 200.

At step 250, etch mask material 252 (e.g., photoresist) is deposited and patterned above the dielectric material 144 to expose a portion of the dielectric material 142 and the previously-formed aperture 155 in the dielectric material 142. The dielectric material 144 is then selectively removed from the area 256 using an etch process 254 that preferentially etches the dielectric material 144 over the dielectric material 142 and the field plate dielectric 115. In one or more embodiments, the dielectric material 144 has a thickness in a range between 150 and 1000 nanometers. In ore more embodiments, although other ranges may be used in one or more other embodiments. Suitable materials for the dielectric material 144 include silicon nitrides, silicon oxides, or multilayer stacks of oxide and/or nitride materials. Any suitable etch process may be used as the etch process 254. For example, in one or more embodiments, the etch process 254 is a dry etching process using fluorine based plasma.

Finally, at step 260, electrically conductive material is deposited on the substrate 102 to form the field plate 150 along with undesired conductive material 264 deposited above the etch mask material 262. The etch mask material 262 is then stripped from the substrate 102, taking the undesired conductive material 264 with it in a lift-off process that leaves only the field plate 150 behind. As shown, etch mask material 262 may be patterned such that the field plate 150 fills the aperture 155 shown in FIG. 1 and optionally overlies the dielectric material 142 and 144 to either side of the aperture 155. including overlying all or part of the control electrode 130.

As above, the process 200 confers at least the advantage that the location of the first end 132 of the control electrode 130 within the aperture 135 and the location of the first end 152 of the field plate 150 are determined by the areas 216 and 218 defined in the single step 210. Thus, even though the control electrode 130 is formed at step 230 and the field plate is formed at step 260 (in an area defined at step 250), the performance characteristics of transistors such as the transistor 100 may be made less susceptible to alignment variations between the patterning steps 210 and 250, because the location of the performance-critical portion of the field plate 150 relative to the control electrode 130 is defined at step 210.

Figure 3A:
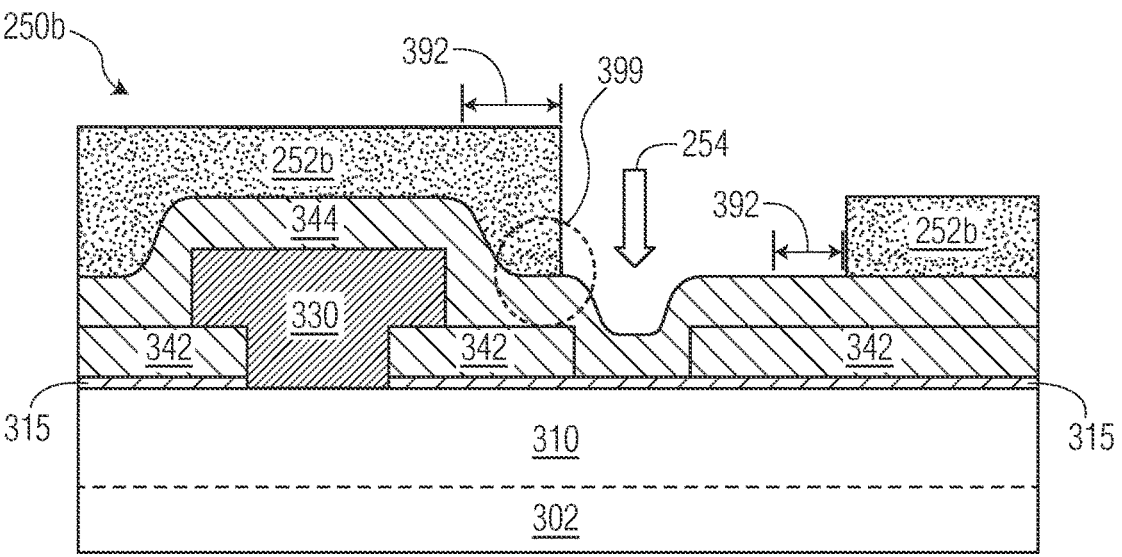
FIG. 3A is a cross-sectional schematic view of a variation in the process of FIG. 2 corresponding to misalignment at one of the patterning steps in the process of FIG. 2.

FIG. 3A shows the example process step 250b in which the etch mask 252b determines where the dielectric material 344 will be removed using the etch process 254 of process 200. Replacing step 250 of the process 200 with step 250b results in the transistor 300, which is a variation of the transistor 100 described further below in connection with FIG. 3B. Step 250b differs from the step 250 only in that the etch mask material 242b (e.g., the etch mask material 252) has been translated to the right by the offset distance 392, resulting in the dielectric material 344 (e.g., the dielectric material 144) being preserved from removal by the etch process 254 in the area 399 as well as on the opposite side of the aperture 355. However, because of the multiple dielectric materials 315, 342, 344, the impact on device performance caused by the offset distance 392 shown will tend to be small because the center-to-center distance 190 between the control electrode 330 and the field plate 350 is not altered by the misalignment, nor is the area of the channel region 310 that is capacitively coupled to the field plate 350 across field plate dielectric 315 within the aperture 355.

Figure 3B:
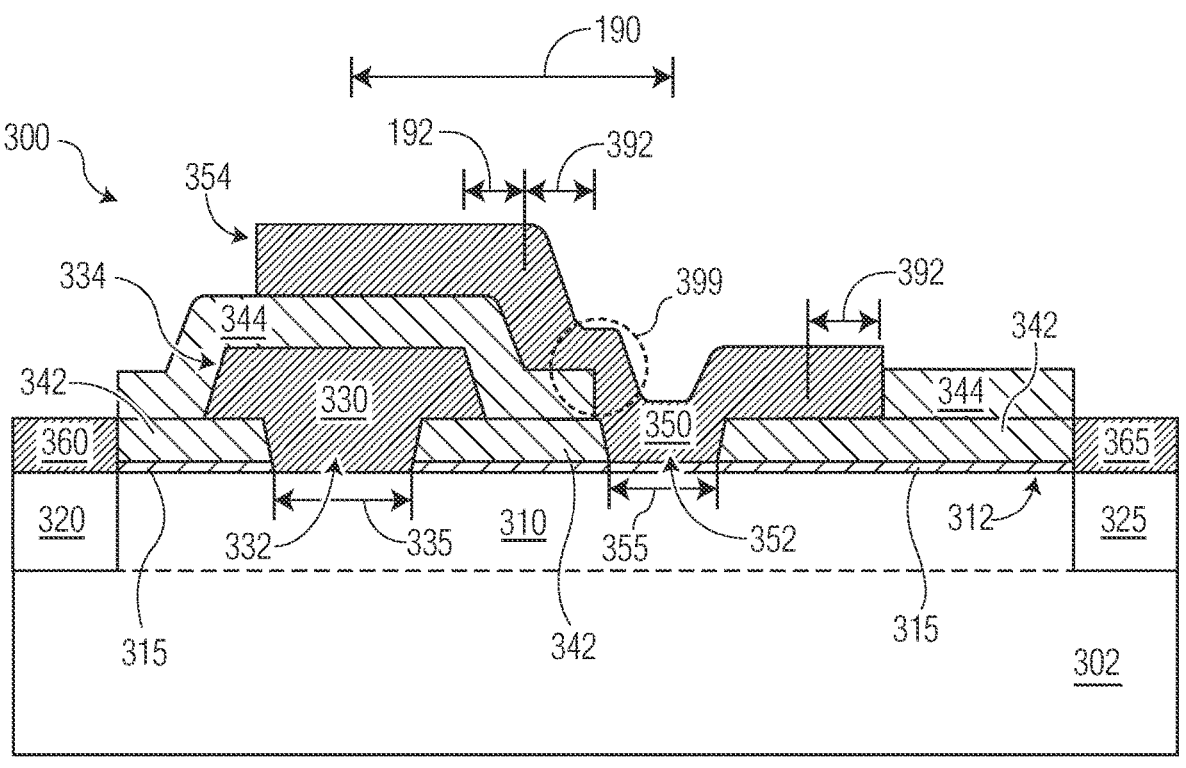
FIG. 3B is a cross-sectional schematic view of example transistor related to the example of FIG. 1 which may result from the process variation of FIG. 3A according to embodiments herein.

FIG. 3B is a cross-sectional schematic view of example transistor 300 according to embodiments herein that is a variation of the example transistor 100 which may result from a realistic alignment offset between step 210 of the process 200 that defines the location of the apertures 135, 155 and step 250 which defines the larger opening in the area 256 that includes the aperture 155 in the dielectric material 142. Similarly, to the transistor 100, the transistor 300 is formed on a semiconductor substrate 302 (e.g., the substrate 102). The transistor 300 has a channel region 310 (e.g., the channel region 110) coupled to a first current terminal 320 and a second current terminal 325 (e.g., the current terminals 120,125) with a first electrode (a control electrode 330 such as the control electrode 130) disposed between the two current terminals. The control electrode 330 has a first end 332 and a second end 334. The first end 332 contacts the channel region 310 within an aperture in field plate dielectric 315 (e.g., the field plate dielectric 115). The transistor 300 also includes a second electrode which is suitable for use a source-coupled field plate (a field plate 350, such as the field plate 150) that contacts field plate dielectric 315 within an aperture in the dielectric material 342 (e.g., the dielectric material 142).

The transistor 300 differs from the transistor 100 in the area 399. In the transistor 100, the dielectric material 144 extends laterally from the control electrode 130 toward the field plate 150 by a distance 192. Beyond this distance, the dielectric material 142 is covered beneath the field plate 150 adjacent to the aperture 155. However, in the transistor 300, the dielectric material 344 extends from the control electrode 330 toward the field plate 350 by both the distance 192 and an offset distance 392. As a result, the field plate 150 in the area 399 is separated vertically from field plate dielectric 315 by both the dielectric material 342 and the dielectric material 344. However, the center of the aperture 335 remains separated from the center of the aperture 355 by the distance 190, just as in the transistor 100. It will be understood that the influence of a field plate (e.g., a field plate 150,350) 350 on performance of transistors herein will be predominately determined by the portion of the field plate with the strongest capacitive coupling to the channel (i.e. the portion within the apertures 155 and 355, respectively, in the transistors 100,300). Because the apertures 155,355 are self-aligned, respectively, to the apertures 135,335 performance variations introduced by misalignments in subsequent lithography steps (e.g., between the apertures formed at step 210 and the etch mask material 242b formed at step 240b rather than at step 240 as shown in FIG. 2) can be mitigated in embodiments herein comparison to other approaches.

Advantages conferred by the embodiments such as the example transistor 100 may be realized in related embodiments such as an example transistor 400 described below in connection with FIG. 4 and an example transistor 600 described below in connection with FIG. 6. The example transistor 400 may be fabricated using an example process 500 described below in connection with FIG. 5, while the example transistor 600 may be fabricated using an example process 700 described below in connection with FIG. 7.

Figure 4:
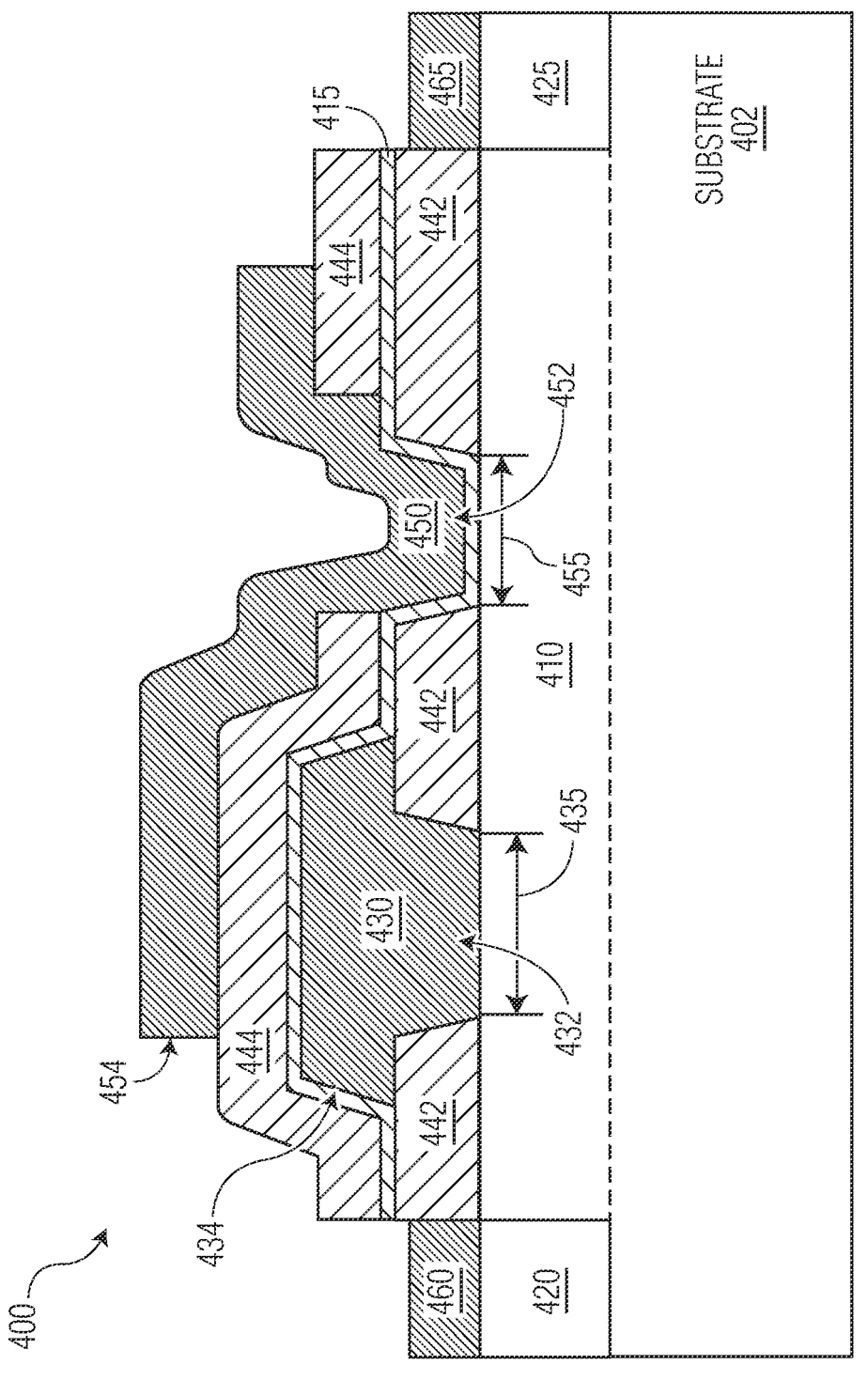
FIG. 4 is a cross-sectional schematic view of another example transistor according to embodiments herein.

FIG. 4 is a cross-sectional schematic view of the example transistor 400 provided with an electrode suitable for use as a field plate according to embodiments herein (the field plate 450). Similarly to the transistor 100, the transistor 400 includes a field plate dielectric 415 (e.g., the field plate dielectric 115) between the field plate 450 and the channel region 410 (e.g., the channel region 110). However, as shown, the placement of the field plate dielectric 415 relative to other dielectric materials may vary from the placement of the field plate dielectric 115 in the transistor 100.

The transistor 400 is formed on a semiconductor substrate 402 (e.g., the substrate 102) and has a channel region 410 near a top surface 412 (e.g., the top surface 112) of the substrate 402. The transistor 400 includes a first current terminal 420 electrically coupled to a first end of the channel region 410 and a second current terminal 425 (electrically coupled to a second end of the channel region 410 opposite the first current terminal 420 (e.g., the current terminals 120,125). The current terminals 420,425 are shown with respective metallic contacts 460,465. A top surface dielectric 442 is disposed on the top surface 412 overlying the channel region 410. The field plate dielectric 415 is disposed directly on the top surface 412 within an aperture 455 in a second top surface dielectric 442 (e.g., the dielectric material 142) which is in turn selectively overlaid by a third dielectric material 444 (e.g., the dielectric material 144), as shown. A first end 432 of the control electrode 430 (e.g., the first end 132 of the control electrode 130) electrically contacts the channel region 410 within an aperture 435 in the top surface dielectric 442. A second end 434 of the control electrode 430 (e.g., the second end 134 of the control electrode 130) overlies the top surface dielectric 442 above and adjacent to the aperture 435 in the top surface dielectric 442. A first end 452 of the field plate 450 is disposed within the aperture 455 in the top surface dielectric 442.

Figure 5:
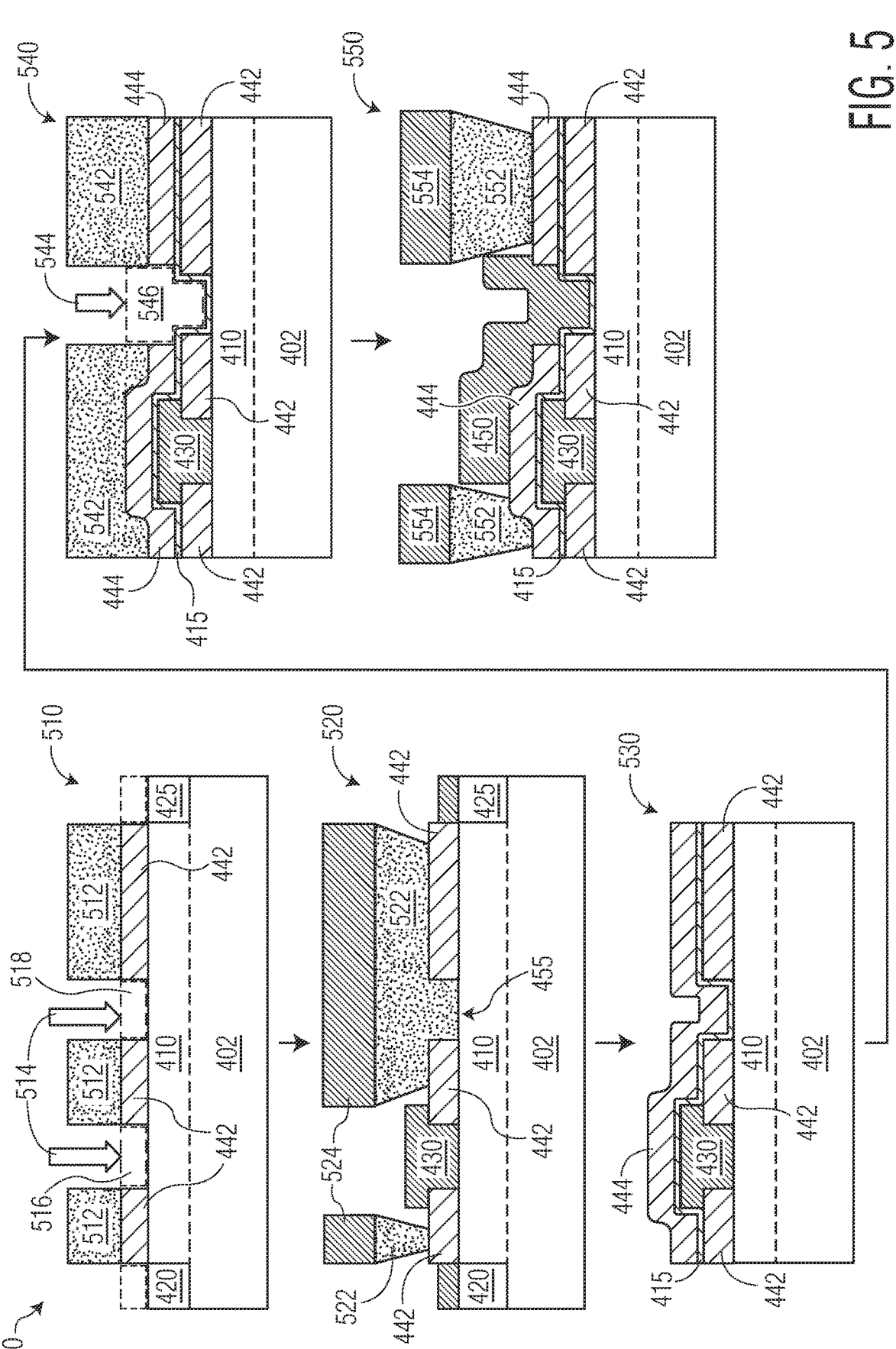
FIG. 5 is a cross-sectional schematic illustration of steps in an example process flow that is suitable for use in fabricating the example transistor of FIG. 4 according to embodiments herein.

It will be appreciated that configuration of the transistor 400 may have similar benefits to those associated with the transistor 100. Specifically, the relative thicknesses and dielectric constants of the dielectric materials 415,442,444 may be chosen to provide reduced $C_{GD}$ when the field plate 450 is operated as a source-coupled field plate (e.g., electrically coupled to the current terminal 420 while the current terminal 420 is operated as the source terminal of the transistor 400) while mitigating additional $C_{GS}$ due to the field plate 450. For instance, in one more embodiments, the relative dielectric constant of field plate dielectric 415 is larger than the relative dielectric constants of the dielectric materials 442,444. As an example, in one more embodiments, the equivalent oxide thickness field plate dielectric has FIG. 5 illustrate example steps in an example process 500 for fabricating transistors with second electrodes operable as source-coupled field plates according to embodiments herein. The process 500 includes steps 510, 520, 530, 540, and 550, which are depicted being performed to fabricate the transistor 400 of FIG. 4 on the substrate 402. As described below, the process 500 may confer certain advantages related to the advantages discussed in connection with process 200 above by allowing the relative positioning of the apertures 435,455 to be determined at the same time by a single patterning step (e.g., by a single photolithographic exposure and subsequent etch) even though the control electrode 430 and the field plate 450 may be formed later in separate steps.

At the outset of the process 500, the substrate 402 may already be provided with channel region 410, and the top surface dielectric 442 above the top surface 412 of the channel region 410, and with the current terminals 420,425 as described in connection with FIG. 4. Accordingly, the top surface dielectric 442 may be referred to as a top surface dielectric in the context of the transistor 400, the process 500.

At step 510, the top surface dielectric 442 is patterned above channel region 410. As shown, an etch mask material 512 (e.g., the etch mask material 212) is deposited and patterned to create openings above the areas 516,518 where the top surface dielectric 442 is removed using an etch process 514 (e.g., the etch process 214), simultaneously creating the apertures 435,455 of FIG. 4 in the process. The etch process 514 should create minimal etch damage to the top surface 412 above the channel region 410. The etch process 514 may be any suitable etch process, as described above in connection with the etch process 214 of FIG. 2 including, as a nonlimiting example, an anisotropic plasma sputtering etch or a reactive ion etch process. Although step 510 is described as a subtractive process above, it will be appreciated that in one more embodiments, the top surface dielectric 442 may be patterned using any suitable process including additive processes such as a lift-off process in which the top surface dielectric 442 is deposited over sacrificial material (e.g., photoresist) which is removed to form the openings in the areas 516,518.

At step 520 electrically conductive material is deposited and patterned on the substrate 402 using any suitable process. For example, as shown, the sacrificial material 522 (e.g., photoresist) patterned above the top surface dielectric 442 remaining after step 510. Undesired electrically conductive material 524 resting on the sacrificial material 522 is removed, leaving the control electrode 430 behind, as shown in FIG. 4. The sacrificial material 522 is then then stripped from the substrate 402 using a solvent, taking the undesired electrically conductive material 524 with it in a lift-off process. It will be appreciated that in other examples other suitable additive or subtractive processes may be used. Optionally, in one or more embodiments, respective contacts 460,465 above the current terminals 420,425 are formed during step 520 as well.

At step 530, field plate dielectric 415 is deposited on the substrate 402 such that it overlies the control electrode 430 and directly overlies the channel region 410 within the aperture 455. The dielectric material 444 is then deposited on top of field plate dielectric 415. For clarity, the current terminals 420,425 are omitted from the illustrations of step 530 and subsequent steps of the process 500.

At step 540, etch masking material 542 is deposited and patterned on the substrate 402, leaving an opening area 546 through which the dielectric material 444 is selectively removed using an etch process 544 (e.g., the etching process 254). As described above in connection with the etch process 254 of FIG. 2, the etch process 544 is any suitable etching process which preferentially removes the dielectric material 444 while leaving field plate dielectric 415 within the aperture 455 intact.

Finally, at step 550, electrically conductive material is deposited and patterned using any suitable method. For instance, as shown, sacrificial material 552 (e.g., photoresist) is patterned to expose the area 546 in which the dielectric material 444 was removed in step 540, as well as adjacent areas as shown, followed by deposition of electrically conductive material that forms the field plate 450. The sacrificial material 552 is then stripped from the substrate in a lift-off process that removes undesired conductive material 554 with it.

Figure 6:
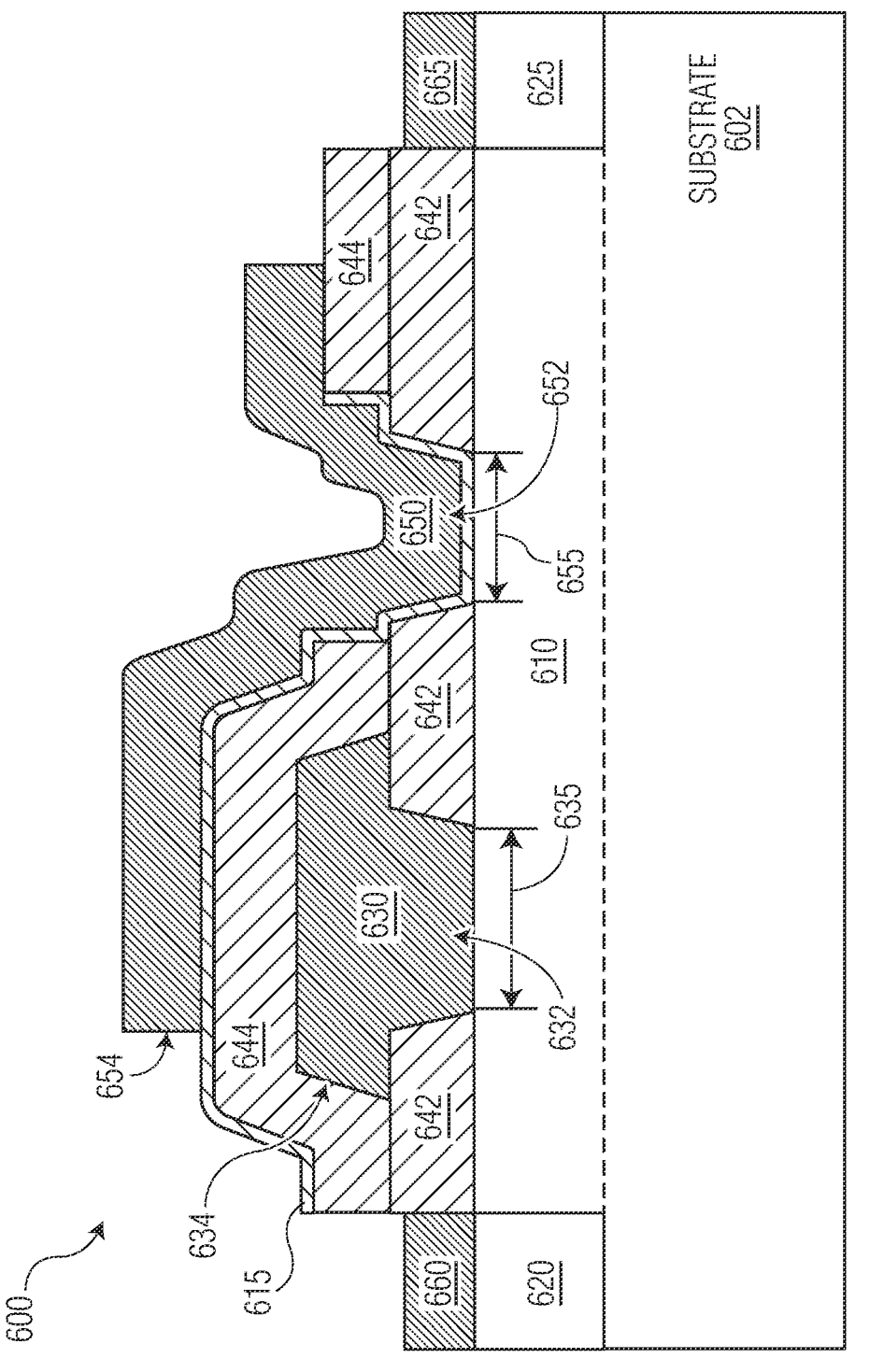
FIG. 6 is a cross-sectional schematic view of another example transistor according to embodiments herein.

FIG. 6 is a cross-sectional schematic view of the example transistor 600 provided with an electrode suitable for use as a field plate according to embodiments herein (the field plate 650) that is most closely related to the transistor 400 of FIG. 4. Similarly to the transistors 100,400 the transistor 600 includes a field plate dielectric 615 (e.g., the field plate dielectric 115/415) between the field plate 650 and the channel region 610 (e.g., the channel region 110/410). However, as shown, the placement of the field plate dielectric 615 relative to other dielectric materials may vary from the placement of the field plate dielectric 115/415 in the transistors 100/400.

The transistor 600 is formed on a semiconductor substrate 602 (e.g., the substrate 102/402) and has a channel region 610 near a top surface 612 (e.g., the top surface 112/412) of the substrate 602. The transistor 600 includes a first current terminal 620 electrically coupled to a first end of the channel region 610 and a second current terminal 625 (electrically coupled to a second end of the channel region 610 opposite the first current terminal 620 (e.g., the current terminals 120,125/420,425). The current terminals 620,625 are shown with respective metallic contacts 660,665. The top surface dielectric 642 is deposited on the top surface 612 overlying the channel region 610. The field plate dielectric 615 is disposed after the etched patterning of dielectric material 644 as in process step 750 within an aperture 655 in the top surface dielectric 642 (e.g., the dielectric material 142/442) which is in turn overlaid selectively by a second dielectric material 644 (e.g., the dielectric material 144/444), as shown. A first end 632 of the control electrode 630 electrically contacts the channel region 610 within an aperture 635 in the top surface dielectric 642. A second end 634 of the control electrode 630 overlies the top surface dielectric 642 above and adjacent to the aperture 635 in the top surface dielectric 642. A first end 652 of the field plate 650 is disposed within the aperture 655 in the top surface dielectric 642.

It will be appreciated that configuration of the transistor 600 may have similar benefits to those associated with the transistors 100,400. Specifically, the relative thicknesses and dielectric constants of the dielectrics 615,642,644 may be chosen to provide reduced $C_{GD}$ when the field plate 650 is operated as a source-coupled field plate (i.e., electrically coupled to the current terminal 620 while the current terminal 620 is operated as the source terminal of the transistor 600) while mitigating additional $C_{GS}$ due to the field plate 650. For instance, in one more embodiments, the relative dielectric constant of the field plate dielectric 615 is larger than the relative dielectric constants of the dielectrics 642, 644.

Figure 7:
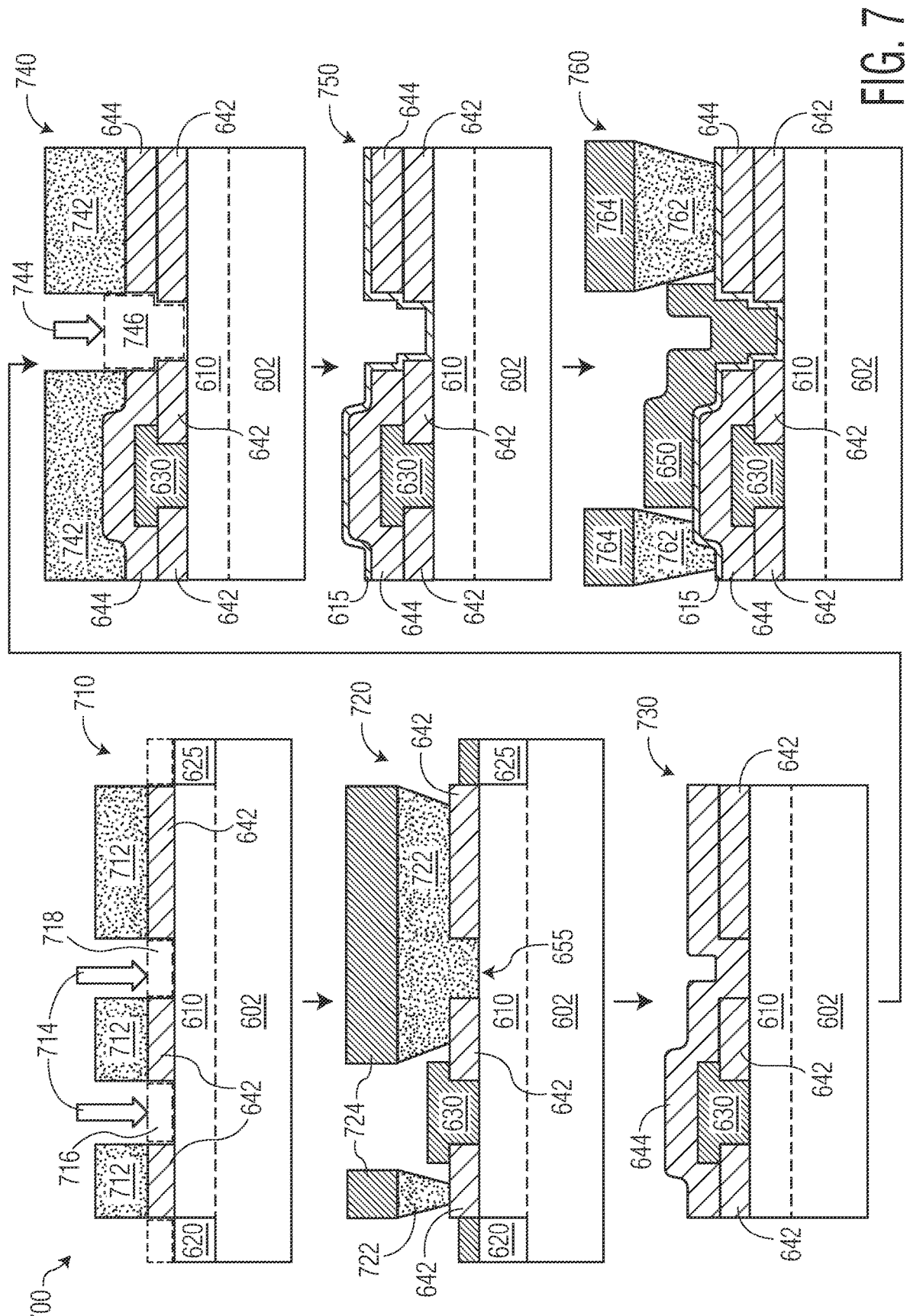
FIG. 7 is cross-sectional schematic illustration of steps in an example process flow that is suitable for use in fabricating the example transistor of FIG. 6 according to embodiments herein.

FIG. 7 illustrates example steps in an example process 700 for fabricating transistors with second electrodes operable as source-coupled field plates according to embodiments herein. The process 700 includes steps 710, 720, 730, 740, and 750, which are depicted being performed to fabricate the transistor 600 of FIG. 6 on the substrate 602. As described below, the process 700 may confer certain advantages related to the advantages discussed in connection with processes 200,500 above by allowing the relative positioning of the apertures 535,555 to be determined at the same time by a single patterning step (e.g., by a single photolithographic exposure) even though the control electrode 630 and the field plate 650 may be formed later in separate steps.

At the outset of the process 700, the substrate 602 may already be provided with channel region 610, and the top surface dielectric 642 above the top surface 612 of the channel region 610, and with the current terminals 620,625 as described in connection with FIG. 6. Accordingly, the top surface dielectric 642 may be referred to as a top surface dielectric in the context of the transistor 600, and the process 700.

At step 710, the top surface dielectric 642 is patterned above channel region 610. As shown, an etch mask material 712 (e.g., the etch mask material 512) is deposited and patterned to create openings above the areas 716,718 where the top surface dielectric 642 is removed using an etch process 714 (e.g., the etch process 214/514), simultaneously creating the apertures 635,655 of FIG. 6 in the process. In one or more embodiments, the top surface dielectric 642 is characterized by a first etch rate with respect to the etch process 714 that is not damaging the top surface 612 in the channel region of 610 with respect to the etch process 714. The etch process 714 may be any suitable etch process, as described above in connection with the etch process 214 of FIG. 2 and the etch process 514 of FIG. 5, including, as a nonlimiting example, an anisotropic plasma sputtering etch or a reactive ion etch process. Although step 710 is described as a subtractive process above, it will be appreciated that in one more embodiments, the top surface dielectric 642 may be patterned using any suitable process including additive processes such as a lift-off process in which the top surface dielectric 642 is deposited over sacrificial material (e.g., photoresist) which is removed to form the openings in the areas 716,718.

At step 720 electrically conductive material is deposited and patterned on the substrate 602 using any suitable process. For example, as shown, the sacrificial material 722 (e.g., photoresist) patterned above the top surface dielectric 642 remaining after step 710. Undesired electrically conductive material 724 resting on the sacrificial material 722 is removed, leaving the control electrode 630 behind, as shown in FIG. 6. The sacrificial material 722 is then stripped from the substrate 602 using a solvent, taking the undesired electrically conductive material 724 with it (a lift-off process). It will be appreciated that in other examples other suitable additive or subtractive processes may be used.

Optionally, in one or more embodiments, respective contacts 660,665 above the current terminals 620,625 during step 720 as well.

At step 730, the dielectric material 644 is deposited on the substrate 602 such that it overlies the control electrode 630 and directly overlies the channel region 610 within the aperture 655. For clarity, the current terminals 620,625 are omitted from illustrations of step 730 and subsequent steps.

At step 740, etch masking material 742 is deposited and patterned on the substrate 602, leaving an opening that the dielectric material 644 to be selectively removed from the area 746 using an etch process 744. The etch process 744 is any suitable etching process which preferentially removes the dielectric material 644 while leaving dielectric 642 minimally etched and the top surface 612 of the channel region 110 intact within the aperture 655 intact. In one more embodiments, the etch process 744 is the same as the etch process 254 or the etch process 544.

At step 750, the field plate dielectric 615 is deposited over the substrate 602 such that it directly overlies the channel region 610 within the aperture 655 and directly overlies the dielectric material 644 elsewhere.

Finally, at step 760, electrically conductive material is deposited and patterned using any suitable method. For instance, as shown, sacrificial material 762 (e.g., photoresist) is patterned as shown, followed by deposition of electrically conductive material that forms the field plate 650. The sacrificial material 762 is then stripped from the substrate in a lift-off process that removes undesired conductive material 764 with it. As shown, The field plate 650 fills the aperture of 655, and optionally overlies the top surface dielectric 642 and the dielectric material 644 to in between the rightmost edge of the aperture 655 and the current terminal 625.

It will be understood that, in or more embodiments, various dielectric layers and electrodes described herein may be jointly configured and arranged to achieve certain performance metrics or other device characteristics and that such metrics may be defined in absolute or relative terms. Non-limiting examples include absolute capacitance values such as $C_{GD}$ and/or $C_{GS}$ as well as ratios between such capacitance values. These and other capacitance values may be expressed in term of absolute capacitances or capacitances per unit of cross-sectional area or per unit of length.

EXAMPLES

Features of embodiments may be understood by way of one or more of the following examples:

Example 1: A method of fabricating a semiconductor devices that includes receiving a semiconductor substrate. The substrate has a channel region suitable for use as a transistor channel, a field plate dielectric in direct contact with a top surface of the substrate that overlies the channel region, and additional dielectric material that overlies and directly contacts the field plate dielectric. The method further includes simultaneously forming first and second apertures in the additional dielectric material above the channel region, forming a control electrode within the first aperture that directly contacts the top surface of the substrate, and forming a field plate electrode in the second aperture that is separated from the top surface of the substrate by the field plate dielectric. The first aperture is disposed at a location between a first end of the channel region and a second end of the channel region. The second aperture is separated from the first aperture by the additional dielectric material and disposed at a location between the first aperture and the second end of the channel region.

Example 2: A method as in Example 1, where forming the first and second apertures includes selectively removing a portion of the additional dielectric material using a first etching process that preferentially removes the additional dielectric material without exposing the top surface of the substrate beneath the field plate dielectric.

Example 3: A method as in Example 2, where the first etching process is an anisotropic plasma etching process.

Example 4: A method as either of Example 2 and Example 3, where the field plate dielectric is characterized by a first etch rate with respect to the first etching process and the additional dielectric material is characterized by second etch rate with respect to the first etching process that is greater than the first etch rate.

Example 5: A method as in any of Examples 1-4, where forming the control electrode within the first aperture includes performing a second etching process that preferentially removes the field plate dielectric within the first aperture.

Example 6: A method as in any of Examples 1-5, that also includes patterning a third dielectric material that overlies the control electrode and the additional dielectric material.

Example 7: A method as in Example 6, where forming the field plate electrode includes forming an aperture in third dielectric material above the second aperture in the additional dielectric material; and depositing electrically conductive material within the second aperture in the additional dielectric material and within the aperture in the third dielectric material to form a first end of the field plate electrode.

Example 8: A method as in either of Example 6 and Example 7, where forming the field plate electrode includes forming the field plate electrode includes depositing electrically conductive material above the control electrode and the third dielectric material to form a second end of the field plate electrode that is electrically coupled to the first end of the field plate electrode.

Example 9: A method as in any of Examples 1-8 that also includes electrically coupling the field plate electrode to a first current terminal that is electrically coupled to the first end of the channel region.

Example 10: A method as in any of Examples 6-8, where forming the field plate electrode includes forming a portion of the field plate electrode that overlies the additional dielectric material within the aperture in the third dielectric material.

Example 11: A method as in any of Examples 1-10, where the field plate dielectric has an equivalent oxide thickness between 25 and 500 Angstroms, the additional dielectric material has an equivalent oxide thickness between 50 and 1000 Angstroms, and the equivalent oxide thickness of the additional dielectric material is greater than the equivalent oxide thickness of the field plate dielectric.

Example 12: A method as in any of Examples 1-11, where forming the control electrode includes forming a top portion of the control electrode that overlies the additional dielectric material adjacent to the first aperture.

Example 13: A method as in any of Examples 1-12, where the channel region wherein the channel region includes a semiconductor heterostructure configured to form a two-dimensional electron gas (2DEG) at an interface between two semiconductor layers.

Example 14: A semiconductor device that includes a channel region within a semiconductor substrate. The channel region is suitable for use as a semiconductive transistor channel and has a first end and a second end. The device also includes a first current terminal electrically coupled to the first end of the channel region and a second current terminal coupled to the second end of the channel region; a field plate dielectric disposed in direct contact with a top surface of the substrate above the channel region; additional dielectric material disposed above the field plate dielectric. The device also has a control electrode and a field plate electrode.

A first aperture passes through the field plate dielectric and the top surface dielectric at a location between the first end of the channel region and the second end of the channel region. The control electrode has a first end that electrically contacts the channel region within the first aperture and a second end that overlies the additional dielectric material adjacent to the first aperture. Third dielectric material is disposed above the control electrode and above the additional dielectric material.

A second aperture is disposed in the additional dielectric material above the channel region at a location between the control electrode and the second end of the channel region; and an aperture in the third dielectric material is disposed above the second aperture in the additional dielectric material. The field plate electrode has first end that is capacitively coupled to the channel region across the field plate dielectric within the second aperture in the additional dielectric material. The field plate electrode also has a second end that overlies the control electrode and is separated from the control electrode by the third dielectric material. In or more embodiments, the field plate electrode is electrically coupled to the first terminal.

Example 15: A device as in Example 14, in which the field plate electrode is electrically coupled to the first current terminal.

Example 16: A device as in either of Example 14 and Example 15, in which the field plate electrode overlies the additional dielectric material within the aperture in the third dielectric material.

Example 17: A device as in any Examples 14-16 where the field plate electrode overlies the additional dielectric material within the aperture in the third dielectric material.

Example 18: A device as in any Examples 14-17 where the field plate electrode includes a section that extends toward the second end of the channel region that overlies the third dielectric material at a location between the second aperture in the additional dielectric material and the second end of the channel region.

Example 19: A device as in any Examples 14-18 where a capacitance per area between control electrode and the field plate electrode is less than 25% of a capacitance per area between the first end of the field plate electrode and the channel region Example 20: A device as in any Examples 14-19 where the first and second apertures in the additional dielectric material are formed by an anisotropic plasma etching process Example 21: A device as in any Examples 14-18 where the channel region wherein the channel region includes a semiconductor heterostructure configured to form a two-dimensional electron gas (2DEG) at an interface between two semiconductor layers.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

As used herein, a "node" or "terminal" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A method of fabricating a semiconductor device comprising:

receiving a semiconductor substrate that includes a channel region suitable for use as a transistor channel;

depositing a field plate dielectric layer in direct contact with a top surface of the substrate over the channel region, wherein the field plate dielectric layer has a first thickness;

depositing a second dielectric layer over the channel region, wherein the second dielectric layer has a second thickness that is greater than the first thickness;

simultaneously forming first and second apertures in the second dielectric layer above the channel region, wherein the first aperture is disposed at a location between a first end of the channel region and a second end of the channel region; and the second aperture is separated from the first aperture by a portion of the second dielectric layer and disposed at a location between the first aperture and the second end of the channel region;

forming a control electrode within the first aperture, wherein the control electrode has a first end that directly contacts the top surface of the substrate, and a second end that overlies and contacts an upper surface of the second dielectric layer between the first aperture and the second aperture;

depositing a third dielectric layer over the control electrode and within the second aperture;

forming a third aperture in the third dielectric layer, wherein the third aperture spans and is wider than the second aperture; and forming a field plate electrode from an electrically conductive material that is simultaneously deposited in the second aperture and the third aperture, wherein a first end of the field plate electrode is separated from the top surface of the substrate by the field plate dielectric layer, and the electrically conductive material extends from the first end of the field plate electrode and from the second and third apertures over the control electrode.

2. The method of claim 1, wherein forming the first and second apertures includes selectively removing a portion of the second dielectric layer using a first etching process that preferentially removes the second dielectric layer without exposing the top surface of the substrate beneath the field plate dielectric layer.

3. The method of claim 2, wherein:

the first etching process is an anisotropic plasma etching process; and the field plate dielectric layer is characterized by a first etch rate with respect to the anisotropic plasma etching process and the second dielectric layer is characterized by second etch rate with respect to the anisotropic plasma etching process that is greater than the first etch rate.

4. The method of claim 2, wherein:

depositing the second dielectric layer includes depositing the second dielectric layer on the field plate dielectric layer; and the method further includes, after forming the first aperture and before forming the control electrode, performing a second etching process that preferentially removes the field plate dielectric layer within the first aperture.

5. The method of claim 2, wherein:

the field plate dielectric layer has a first equivalent oxide thickness in a range between 25 and 500 Ångströms;

the second dielectric layer has a second equivalent oxide thickness in range between 50 and 1000 Ångströms; and

the second equivalent oxide thickness is greater than the first equivalent oxide thickness.

6. The method of claim 1, further comprising:

forming a first current terminal that is electrically coupled to the first end of the channel region; and electrically coupling the field plate electrode to the first current terminal.

7. The method of claim 1, wherein:

the field plate dielectric layer has a first equivalent oxide thickness between 25 and 500 Ångströms;

the second dielectric layer has a second equivalent oxide thickness between 50 and 1000 Ångströms; and the second equivalent oxide thickness is greater than the first equivalent oxide thickness.

8. The method of claim 1, wherein forming the field plate electrode includes forming a portion of the field plate electrode that overlies the second dielectric layer on a side of the second aperture and within the third aperture.

9. The method of claim 1, wherein the step of depositing the field plate dielectric layer is performed before the step of depositing the second dielectric layer, and before the step of simultaneously forming the first and second apertures so that the field plate dielectric layer underlies the second dielectric layer.

* * * * *